US008039202B2

(12) United States Patent
Sui et al.

(10) Patent No.: US 8,039,202 B2
(45) Date of Patent: Oct. 18, 2011

(54) POSITIVE-WORKING PHOTOIMAGEABLE BOTTOM ANTIREFLECTIVE COATING

(75) Inventors: Yu Sui, Shizuoka (JP); Hengpeng Wu, Hillsborough, NJ (US); Wenbing Kang, Shizuoka (JP); Mark O. Neisser, Whitehouse Station, NJ (US); Tomohide Katayama, Shizuoka (JP); Shuji S. Ding-Lee, Branchburg, NJ (US); Aritaka Hishida, Bedminster, NJ (US); Joseph E. Oberlander, Phillipsburg, NJ (US); Medhat E. Toukhy, Flemington, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 29 days.

(21) Appl. No.: 11/877,891

(22) Filed: Oct. 24, 2007

(65) Prior Publication Data

US 2008/0090184 A1 Apr. 17, 2008

Related U.S. Application Data

(62) Division of application No. 10/808,884, filed on Mar. 25, 2004, now abandoned.

(51) Int. Cl.
*G03F 7/26* (2006.01)
(52) U.S. Cl. ...................................... 430/311
(58) Field of Classification Search .................. 430/311, 430/330
See application file for complete search history.

(56) References Cited

U.S. PATENT DOCUMENTS

| | | | |
|---|---|---|---|
| 3,523,795 A | 8/1970 | Ohkubo et al. | |
| 4,061,465 A | 12/1977 | Franklin et al. | |
| 4,229,274 A | 10/1980 | Carlblom | |
| 4,388,450 A | 6/1983 | Crivello | |
| 4,491,628 A | 1/1985 | Ito et al. | |
| 4,845,265 A | 7/1989 | Lapin et al. | |
| 4,863,827 A | 9/1989 | Jain et al. | |
| 4,910,122 A | 3/1990 | Arnold et al. | |
| 5,069,997 A | 12/1991 | Schwalm et al. | |
| 5,114,826 A | 5/1992 | Kwong et al. | |
| 5,242,715 A | 9/1993 | Schoen et al. | |
| 5,286,867 A | 2/1994 | Lohaus et al. | |
| 5,338,641 A | 8/1994 | Pawlowski et al. | |
| 5,340,682 A | 8/1994 | Pawlowski et al. | |
| 5,350,660 A | 9/1994 | Urano et al. | |
| 5,354,643 A | 10/1994 | Cabrera et al. | |
| 5,362,608 A * | 11/1994 | Flaim et al. | 430/327 |
| 5,482,817 A | 1/1996 | Dichiara et al. | |
| 5,585,219 A | 12/1996 | Kaimoto et al. | |
| 5,635,333 A | 6/1997 | Petersen et al. | |
| 5,650,261 A | 7/1997 | Winkle | |
| 5,652,297 A | 7/1997 | McCulloch et al. | |
| 5,716,756 A | 2/1998 | Pawlowski et al. | |
| 5,731,386 A | 3/1998 | Thackeray et al. | |
| 5,837,420 A | 11/1998 | Aoai et al. | |
| 5,843,624 A | 12/1998 | Houlihan et al. | |
| 5,876,900 A | 3/1999 | Watanabe et al. | |
| 5,880,168 A | 3/1999 | Heinz et al. | |
| 5,880,169 A | 3/1999 | Osawa et al. | |
| 5,882,996 A | 3/1999 | Dai | |
| 5,886,102 A | 3/1999 | Sinta et al. | |
| 5,935,760 A | 8/1999 | Shao et al. | |
| 5,939,234 A | 8/1999 | Yamanaka et al. | |
| 5,939,235 A | 8/1999 | Kondo et al. | |
| 5,939,236 A | 8/1999 | Pavelchek et al. | |
| 5,972,560 A | 10/1999 | Kaneko et al. | |
| 5,981,145 A | 11/1999 | Ding et al. | |
| 5,997,993 A | 12/1999 | Bi et al. | |
| 6,033,830 A | 3/2000 | Sinta et al. | |
| 6,054,254 A | 4/2000 | Sato et al. | |
| 6,080,530 A * | 6/2000 | Shao et al. | 430/325 |
| 6,103,445 A | 8/2000 | Willson et al. | |
| 6,110,653 A | 8/2000 | Holmes et al. | |
| 6,111,143 A | 8/2000 | Park et al. | |
| 6,114,085 A * | 9/2000 | Padmanaban et al. | 430/270.1 |
| 6,124,077 A | 9/2000 | Imai et al. | |
| 6,132,926 A | 10/2000 | Jung et al. | |
| 6,187,506 B1 | 2/2001 | Ding et al. | |
| 6,200,728 B1 | 3/2001 | Cameron et al. | |
| 6,207,342 B1 | 3/2001 | Takechi et al. | |
| 6,251,562 B1 | 6/2001 | Breyta et al. | |
| 6,319,651 B1 | 11/2001 | Holmes et al. | |
| 6,338,934 B1 | 1/2002 | Chen et al. | |
| 6,358,665 B1 | 3/2002 | Pawlowski et al. | |

(Continued)

FOREIGN PATENT DOCUMENTS

EP 0 794 458 A2 9/1997

(Continued)

OTHER PUBLICATIONS

Office action dated Jan. 27, 2009 from U.S. Appl. No. 11/876,332, which is a divisional of prior U.S. Appl. No. 10/808,884.
The Notification Concerning Transmittal of International Preliminary Report on Patentability (Chapter 1 of the Patent Cooperation Treaty) (Form PCT/IB/326); of the International Preliminary Report on Patentability (Form PCT/IB/373); and of the Written Opinion of the International Searching Authority (Form PCT/ISA/237).
English Language Abstract from Derwent for JP 2001-22057 A.
Office action dated Jun. 24, 2008 from U.S. Appl. No. 11/876,332, which is a divisional of prior U.S. Appl. No. 10/808,884.
Ahn et al., "New Antireflective Coating Materials Containing a Novel Chromophore for KrF Laser Lithography", Journal of Photopolymer Science and Technology, vol. 14, No. 3, pp. 475-pp. 480 (2001).

(Continued)

*Primary Examiner* — Kathleen Duda
(74) *Attorney, Agent, or Firm* — Sangya Jain (57) ABSTRACT

The present invention relates to a positive bottom photoimageable antireflective coating composition which is capable of being developed in an aqueous alkaline developer, wherein the antireflective coating composition comprises a polymer comprising at least one recurring unit with a chromophore group and one recurring unit with a hydroxyl and/or a carboxyl group, a vinyl ether terminated crosslinking agent, and optionally, a photoacid generator and/or an acid and/or a thermal acid generator. The invention further relates to a process for using such a composition.

19 Claims, 1 Drawing Sheet

U.S. PATENT DOCUMENTS

| | | | |
|---|---|---|---|
| 6,395,450 | B1 | 5/2002 | Park et al. |
| 6,447,980 | B1 | 9/2002 | Rahman et al. |
| 6,455,230 | B1 | 9/2002 | Damme et al. |
| 6,723,488 | B2 | 4/2004 | Kudo et al. |
| 6,803,172 | B2 | 10/2004 | Jung et al. |
| 6,831,285 | B2 | 12/2004 | Hol et al. |
| 6,844,131 | B2 | 1/2005 | Oberlander et al. |
| 6,846,612 | B2 | 1/2005 | Deshpande |
| 6,866,984 | B2 | 3/2005 | Jung et al. |
| 7,070,914 | B2 | 7/2006 | Neisser et al. |
| 7,223,518 | B2 | 5/2007 | Henderson et al. |
| 7,265,431 | B2 | 9/2007 | Sivakumar |
| 7,358,408 | B2 | 4/2008 | Rahman et al. |
| 7,514,202 | B2 | 4/2009 | Ohsawa et al. |
| 7,521,170 | B2 | 4/2009 | Rahman et al. |
| 7,521,483 | B2 | 4/2009 | Davey et al. |
| 7,541,134 | B2 | 6/2009 | Iwabuchi et al. |
| 7,678,528 | B2 | 3/2010 | Rahman et al. |
| 7,816,071 | B2 | 10/2010 | Abdallah et al. |
| 7,824,837 | B2 | 11/2010 | Wu et al. |
| 2002/0012880 | A1 | 1/2002 | Imai et al. |
| 2002/0045130 | A1 | 4/2002 | Nitta et al. |
| 2002/0094382 | A1 | 7/2002 | Imai et al. |
| 2003/0129547 | A1 | 7/2003 | Neisser et al. |
| 2003/0162120 | A1 | 8/2003 | Yoon et al. |
| 2003/0215736 | A1 | 11/2003 | Oberlander et al. |
| 2004/0018451 | A1 | 1/2004 | Choi |
| 2004/0152009 | A1 | 8/2004 | Yamaguchi et al. |
| 2005/0053850 | A1 | 3/2005 | Ashebjer et al. |
| 2005/0064326 | A1 | 3/2005 | Yasunami et al. |
| 2005/0095532 | A1 | 5/2005 | Kodama et al. |
| 2005/0214674 | A1 | 9/2005 | Sui et al. |
| 2005/0255410 | A1 | 11/2005 | Guerrero et al. |
| 2005/0271974 | A1 | 12/2005 | Rahman et al. |
| 2005/0277058 | A1 | 12/2005 | Iwabuchi et al. |
| 2005/0287816 | A1 | 12/2005 | Blalock et al. |
| 2006/0177774 | A1 | 8/2006 | Abdallah et al. |
| 2007/0031760 | A1 | 2/2007 | Chang et al. |
| 2007/0184648 | A1 | 8/2007 | Yoon et al. |
| 2007/0219368 | A1 | 9/2007 | Iwabuchi et al. |
| 2008/0008955 | A1 | 1/2008 | Brodsky et al. |
| 2008/0038666 | A1 | 2/2008 | Wu et al. |
| 2008/0138744 | A1 | 6/2008 | Hatanaka et al. |
| 2009/0104559 | A1 | 4/2009 | Houlihan et al. |
| 2010/0119972 | A1 | 5/2010 | Houlihan et al. |
| 2011/0076626 | A1 | 3/2011 | Padmanaban et al. |
| 2011/0086312 | A1 | 4/2011 | Dammel et al. |

FOREIGN PATENT DOCUMENTS

| | | | |
|---|---|---|---|
| EP | 1 033 624 A1 | | 9/2000 |
| EP | 1033624 | * | 9/2000 |
| EP | 1 757 987 A1 | | 2/2007 |
| GB | 2 320 718 A | | 7/1998 |
| JP | 56-47440 A | | 4/1981 |
| JP | 6-295064 A | | 10/1994 |
| JP | 2001-22057 A | | 1/2001 |
| JP | 2004-31569 A | | 1/2004 |
| JP | 2005-70154 A | | 3/2005 |
| WO | WO 97/33198 A1 | | 9/1997 |
| WO | WO 2005/093513 A2 | | 10/2005 |

OTHER PUBLICATIONS

Willson Research Group, University of Texas at Austin, "Aqueous Processable Positive and Negative Tone Photoresists", Apr. 18, 2001, available at http://willson.cm.utexas.edu/Research/Sub_Files/Water_Soluble/index.php (last visited Jun. 9, 2008).

Office action dated Mar. 13, 2009 from U.S. Appl. No. 11/876,332, which is a divisional of U.S. Appl. No. 10/808,884.

Papdopoulos et al., "Dissociation of Salicylic Acid, 2,4-, 2,5- and 2,6-Dihydroxybenzoic Acids in 1-Propanol—Water Mixtures at 25° C", Journal of Solution Chemistry, vol. 20, No. 3, pp. 293-pp. 300 (1991).

Jerry March, "Advanced Organic Chemistry: Reactions, Mechanisms, and Structure", Second Edition, McGraw-Hill Book Company, New York, NY, pp. 225-pp. 245 (1977).

"Lange's Handbook of Chemistry (15th Edition)", Table 8.8 pKa Value of Organic Materials in Water at 25 degrees C Records 1426 and 1428, McGraw-Hill, www.knovel.com, 2 pages (1999).

Office Action dated Jul. 24, 2009 from Chinese Patent Application No. 200580011869.5.

Houlihan et al., "Chemically Amplified Resists: The Chemistry and Lithographic Characteristics of Nitrobenzyl Benzenesulfonate Derivatives", Journal of Photopolymer Science and Technology, vol. 1, No. 3, pp. 259-pp. 273 (1990).

Lee et al., "Performance of vinyl ether cross-linkers on resist for 193 nm lithography", SPIE, vol. 4690, pp. 541-548 (2002).

Moon et al., Three-Component Photopolymers Based on Thermal Cross-Linking and Acidolytic De-Cross-Linking of Vinyl Ether Groups. Effects of Binder Polymers on Photopolymer Characteristics, Chemical Materials, vol. 6 (1994), pp. 1854-pp. 1860.

Moon et al., "Three-component photoresists based on thermal crosslinking and acidolytic cleavage", Polymer 41, pp. 4013-pp. 4019 (2000).

Nakano et al., "Positive-Type Photopolyimide Based on Vinyl Ether Crosslinking and De-Crosslinking", Journal of Photopolymer Science and Technology vol. 13, No. 5, pp. 715-pp. 718 (2000).

Noppakundilograt et al., "Visible Light-Sensitive Positive-Working Photopolymer Based on Poly(p-hydroxystyrene) and Vinyl Ether Crosslinker", Journal of Photopolymer Science and Technology vol. 13, No. 5, pp. 719-pp. 722 (2000).

Schacht et al., "Acid Labile Cross-Linked Units: A Concept for Improved Positive Deep-UV Photoresists", American Chemical Society, pp. 78-pp. 94 (1998).

Schlegel et al., "Studies on the Acid Formation and Deprotection Reaction by Novel Sulfonates in a Chemical Amplification Positive Photoresist", Journal of Photopolymer & Science Technology, vol. 3, No. 3 (1990), pp. 281-pp. 287.

Shirai et al., "Photochemistry of Imino Sulfonate Compounds and Their Application to Chemically Amplified Resists", Journal of Photopolymer Science and Technology, vol. 3, No. 3 (1990), pp. 301-pp. 304.

White et al., "Synthesis and characterization of photodefinable polycarbonates for use as sacrificial materials in the fabrication of microfluidic devices", SPIE vol. 4690, pp. 242-pp. 253 (2002).

Yamada et al., "The design and study of aqueous-processable positibe tone photoresists", SPIE vol. 3999, pp. 569-pp. 578 (2000).

Yamada et al., "Positive and Negative Tone Water Processable Photoresists: A Progress Report", SPIE vol. 3333, pp. 245-pp. 253 (2000).

Yamaoka et al., "Photochemical Dissociation of p-Nitrobenzyl Aromatic Sulfonate and Its Application to Chemical Amplification Resists", Journal of Photopolymer Science and Technology, vol. 3, No. 3 (1990), pp. 275-pp. 280.

Yamaoka et al., "Reaction of vinyl ethers and application of photoreactive process", Trends in Photochemistry & Photobiology, vol. 7, pp. 45-pp. 70 (2001).

Leonard V. Interrante, Chemistry of Materials, vol. 6, No. 10 (1994), Table of Contents only.

CRC Handbook of Chemistry & Physics, "Dissociation Constants of Organic Acids and Bases", CRC Press (1994-1995 75th Edition), pp. 8-45-pp. 8-55.

Office Action dated Oct. 30, 2009 for U.S. Appl. No. 11/876,332.

Form PCT/ISA/220, Form PCT/ISA/210, and Form PCT/ISA/237 for PCT/IB2009/007456 mailed Jan. 25, 2010, which corresponds to U.S. Appl. No. 12/576,622.

English Language Abstract from JPO of JP 56-47440 A.

Database WPI Week 198125 Thomson Scientific, London, GB; AN 1981-44838D XP002546976 & JP 56 047440 A (Japan Synthetic Rubber Co Ltd) Apr. 30, 1981 & JP 56 047440 A (Japan Synthetic Rubber Co Ltd) Apr. 30, 1981.

Form PCT/ISA/220, Form PCT/ISA/210, and Form PCT/ISA/237 for PCT/IB2005/000773 dated Jul. 27, 2005, which corresponds to U.S. Appl. No. 10/808,884.

Notice of Allowance and Fee(s) Due dated Mar. 8, 2010 from U.S. Appl. No. 11/876,332, which is a divisional of U.S. Appl. No. 10/808,884.

Notice of Allowance and Fee(s) Due dated Jun. 16, 2010 from U.S. Appl. No. 11/876,332, which is a divisional of U.S. Appl. No. 10/808,884.

Office Action dated Sep. 18, 2009 from U.S. Appl. No. 11/876,793.

Office Action dated Feb. 4, 2010 from U.S. Appl. No. 11/876,793.

Form PCT/ISA/220, Form PCT/ISA/210, and Form PCT/ISA/237 for PCT/IB2008/002847 dated Oct. 16, 2009, which corresponds to U.S. Appl. No. 11/876,793.

Invitation to Pay Additional Fees and, Where Applicable, Protest Fee (Form PCT/ISA/206) for PCT/IB2009/007451 dated Apr. 7, 2010, which corresponds to U.S. Appl. No. 12/269,072.

Form PCT/ISA/220, Form PCT/ISA/210, and Form PCT/ISA/237 for PCT/IB2009/007449 mailed Feb. 10, 2010, which corresponds to U.S. Appl. No. 12/570,923.

Moon et al., "Two-component Photoresists Containing Thermally Crosslinkable Generators", Polymer Engineering and Science vol. 40, No. 5, pp. 1248-1255 (May 2000)—XP000969783.

Office Action dated Jul. 6, 2010 for U.S. Appl. No. 12/269,072.

English Translation of Office Action dated Jul. 6, 2010 for Chinese Patent Application No. CN 200580011869.5, which corresponds to U.S. Appl. No. 10/808,664.

Office Action dated Oct. 30, 2009 for U.S. Appl. No. 11/876,332, which is a divisional of U.S. Appl. No. 10/808,884.

Office Action dated Sep. 7, 2010 for U.S. Appl. No. 11/876,793.

Office Action dated Sep. 1, 2010 for U.S. Appl. No. 12/269,072.

Form PCT/ISA/220, Form PCT/ISA/210, and Form PCT/ISA/237 for PCT/IB2009/007451 dated Aug. 2, 2010, which corresponds to U.S. Appl. No. 12/269,072.

Complete set of specification papers for U.S. Appl. No. 12/570,923, filed Sep. 30, 2009.

Complete set of specification papers for U.S. Appl. No. 12/576,622, filed Oct. 9, 2009.

Office Action dated Sep. 22, 2010 from European Patent Office for European Patent Application No. 08 843 074.9, which corresponds to U.S. Appl. No. 11/876,793.

English Translation of Office Action mailed Oct. 12, 2010 for Japanese Patent Application No. 2007-504508, which corresponds to U.S. Appl. No. 10/808,884.

Office Action dated Dec. 1, 2010 from U.S. Appl. No. 11/876,793.

Machine Language English Abstract and Translation from JPO of JP 2004-31569 A.

Machine Language English Abstract and Translation from JPO of JP 2005-70154 A.

Jerry March, "0-11 Hydroysis of Esters" from Advanced Organic Chemistry: Reactions, Mechanisms, and Structure, Second Edition, McGraw-Hill Book Company, New York, NY, pp. 349-353.

Comm. pursuant to Article 94(3) EPC dated Feb. 17, 2011 from European Patent Office for European Patent Application No. 08 843 074.9, which corresponds to U.S. Appl. No. 11/876,793.

Office Action dated Apr. 26, 2011 for U.S. Appl. No. 12/269,072.

Notice of Allowance and Fee(s) Due date mailed May 12, 2011 from U.S. Appl. No. 11/876,793.

"Anion volumes database" obtained from http://www.warwick.ac.uk/fac/sci/Chemistry/thermochemistry/anion_volum_database.htm on May 8, 2011.

Advisory Action Before the Filing of an Appeal Brief dated Jul. 6, 2011 for U.S. Appl. No. 12/269,072.

Third Office Action dated Jul. 14, 2011 for Chinese Patent Application No. CN 200580011869.5, which corresponds to U.S. Appl. No. 10/808,884.

English Translation of Third Office Action dated Jul. 14, 2011 for Chinese Patent Application No. CN 200580011869.5, which corresponds to U.S. Appl. No. 10/808,884.

* cited by examiner

Figure 1 - Examples of Photoactive Compounds

US 8,039,202 B2

POSITIVE-WORKING PHOTOIMAGEABLE BOTTOM ANTIREFLECTIVE COATING

CROSS-REFERENCE TO RELATED APPLICATION

This is a divisional of U.S. application Ser. No. 10/808,884, filed Mar. 25, 2004 now abandoned, the contents of which are incorporated herein by reference in its entirety.

FIELD OF INVENTION

The present invention relates to novel positive-working, photoimageable, and aqueous developable antireflective coating compositions and their use in image processing by forming a thin layer of the novel antireflective coating composition between a reflective substrate and a photoresist coating. Such compositions are particularly useful in the fabrication of semiconductor devices by photolithographic techniques, especially those requiring exposure with deep ultraviolet radiation. These coatings are particularly compatible for use with an edge bead remover.

BACKGROUND

Photoresist compositions are used in microlithography processes for making miniaturized electronic components such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked and coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist. There are two types of photoresist compositions, negative-working and positive-working. When positive-working photoresist compositions are exposed image-wise to radiation, the areas of the photoresist composition exposed to the radiation become soluble in a developer solution while the unexposed areas of the photoresist coating remain relatively insoluble to such a solution. Thus, treatment of an exposed positive-working photoresist with a developer causes removal of the exposed areas of the photoresist coating and the formation of a positive image in the coating, thereby uncovering a desired portion of the underlying substrate surface on which the photoresist composition was deposited. In a negative-working photoresist the developer removes the portions that are not exposed.

The trend towards the miniaturization of semiconductor devices has led both to the use of new photoresists that are sensitive to lower and lower wavelengths of radiation, and also to the use of sophisticated multilevel systems to overcome difficulties associated with such miniaturization.

High resolution, chemically amplified, deep ultraviolet (100-300 nm) positive and negative tone photoresists are available for patterning images with less than quarter micron geometries. There are two major deep ultraviolet (uv) exposure technologies that have provided significant advancement in miniaturization, and these are lasers that emit radiation at 248 nm and 193 nm. Examples of such photoresists are given in the following patents and incorporated herein by reference, U.S. Pat. No. 4,491,628, U.S. Pat. No. 5,350,660, EP 794458 and GB 2320718. Photoresists for 248 nm have typically been based on substituted polyhydroxystyrene and its copolymers. On the other hand, photoresists for 193 nm exposure require non-aromatic polymers, since aromatics are opaque at this wavelength. Generally, alicyclic hydrocarbons are incorporated into the polymer to replace the etch resistance lost by eliminating the aromatic functionality. Furthermore, at lower wavelengths the reflection from the substrate becomes increasingly detrimental to the lithographic performance of the photoresist. Therefore, at these wavelengths antireflective coatings become critical.

The use of highly absorbing antireflective coatings in photolithography is a simpler approach to diminish the problems that result from back reflection of light from highly reflective substrates. The bottom antireflective coating is applied on the substrate and then a layer of photoresist is applied on top of the antireflective coating. The photoresist is exposed image-wise and developed. The antireflective coating in the exposed area is then typically etched and the photoresist pattern is thus transferred to the substrate. Most antireflective coatings known in the prior art are designed to be dry etched. The etch rate of the antireflective film needs to be relatively high in comparison to the photoresist so that the antireflective film is etched without excessive loss of the resist film during the etch process. There are two known types of antireflective coatings, inorganic coatings and organic coatings. However, both of these types of coatings have so far been designed for removal by dry etching.

In addition, photoresist patterns may be damaged or may not be transferred exactly to the substrate if the dry etch rate of the antireflective coating is similar to or less than the etch rate of the photoresist coated on top of the antireflective coating. The etching conditions for removing the organic coatings can also damage the substrate. Thus, there is a need for organic bottom antireflective coatings that do not need to be dry etched and can also provide good lithographic performance, especially for compound semiconductor type substrates, which are sensitive to etch damage.

The novel approach of the present application is to use an absorbing, positive image-forming bottom antireflective coating that can be developed by an aqueous alkaline solution, rather than be removed by dry etching. Aqueous removal of the bottom antireflective coating eliminates the dry etch rate requirement of the coating, reduces the cost intensive dry etching processing steps and also prevents damage to the substrate caused by dry etching. The absorbing bottom antireflective coating compositions of the present invention contain a crosslinking compound and a polymer. The coating is cured and then upon exposure to light of the same wavelength as that used to expose the top positive photoresist become imageable in the same developer as that used to develop the photoresist. This process greatly simplifies the lithographic process by eliminating a large number of processing steps. Since the antireflective coating is photosensitive, the extent of removal of the antireflective coating is defined by the latent optical image, which allows a good delineation of the remaining photoresist image in the antireflective coating.

Bilevel photoresists are known, as in U.S. Pat. No. 4,863,827, but require exposure of two different wavelengths for the top and bottom photoresists, which complicates the processing of the lithography.

There are many patents that disclose antireflective coating compositions but these coatings are all cured to be insoluble in an aqueous developer solution and must be removed by dry etching. U.S. Pat. No. 5,939,236 describes an antireflective coating containing a polymer, an acid or thermal acid generator, and a photoacid generator. However this film is completely crosslinked to make it insoluble in an alkaline aqueous developer solution. The film is removed by a plasma gas etch. Examples of other antireflective coating patents are U.S. Pat. No. 5,886,102, U.S. Pat. No. 6,080,530 and U.S. Pat. No. 6,251,562.

U.S. Pat. No. 4,910,122 discloses an aqueous developable antireflective coating, however the degree of solubility of the total film is controlled by the bake conditions. This antireflective coating is not photoimageable, and therefore, there are no clearly defined soluble and insoluble regions in the film. The dissolution of the antireflective coating is controlled by bake conditions and thus the antireflective coating is very sensitive to the developer normality and developing time, and also gives poor resolution. High normality developer and/or long develop times can cause excessive removal of the antireflective coating.

Another process for imaging photoresists using antireflective coatings is disclosed in U.S. Pat. No. 5,635,333; however, the antireflective coating is not developed at the same time as the photoresist.

U.S. Pat. No. 5,882,996 describes a method of patterning dual damascene interconnections where a developer soluble antireflective coating interstitial layer is used. The antireflective coating is formed between two photoresist layers and has a preferred thickness of 300-700 angstroms, refractive index of 1.4-2.0 and is water soluble. The antireflective coating is not photoimageable and there is no description of the chemistry of the antireflective coating.

Acid sensitive antireflective coatings using differing chemistries are disclosed in U.S. Pat. No. 6,110,653, U.S. Pat. No. 6,319,651, U.S. Pat. No. 6,054,254 and US 2004/0018451.

The novel antireflective composition of the present invention relates to a photoimageable, aqueous alkali developable, positive-working antireflective coating. The antireflective coating composition of the instant invention is coated on a substrate before applying a positive photoresist layer, in order to prevent reflections in the photoresist from the substrate. The solid components of the antireflective coating are soluble in common photoresist solvents and capable of forming a coating, and furthermore are compatible with edge-bead remover solvents. Edge-bead remover solvents are used to remove the build-up on the edges of the antireflective coating formed during the spin coating process. This antireflective coating is photoimageable at the same wavelength of actinic radiation as the top photoresist layer applied thereupon, and is also developable with the same aqueous alkaline developing solution as that used for typically developing a photoresist. The combination of single exposure step and single development step greatly simplifies the lithographic process. Furthermore, an aqueous developable antireflective coating is especially desirable for imaging with photoresists that do not contain aromatic functionalities, such as those used for 193 nm and 157 nm exposures. The novel composition enables a good image transfer from the photoresist to the substrate, and also has good absorption characteristics to prevent reflective notching and line width variations or standing waves in the photoresist. Additionally, substantially no intermixing is present between the antireflective coating and the photoresist film. The antireflective coatings also have good solution stability and form thin films with good coating quality, the latter being particularly advantageous for lithography. When the antireflective coating is used with a photoresist in the imaging process, clean images are obtained, without damaging the substrate.

SUMMARY OF THE INVENTION

The present invention relates to a positive bottom photoimageable antireflective coating composition which is capable of being developed in an aqueous alkaline developer, wherein the antireflective coating composition comprises a polymer comprising at least one recurring unit with a chromophore group and one recurring unit with a hydroxyl and/or a carboxyl group, a vinyl ether terminated crosslinking agent, and optionally, a photoacid generator. The invention may further comprise an acid or a thermal acid generator, preferably where the acid or the acid generated from the thermal acid generator has a pKa greater than 1.0. The invention further relates to a process for imaging using the antireflective composition of the present invention, especially with an edge-bead removal step.

DESCRIPTION OF THE INVENTION

The present invention relates to a novel absorbing, photoimageable and aqueous developable positive image-forming antireflective coating composition comprising a polymer comprising at least one unit with a hydroxyl and/or carboxyl group and at least one unit with an absorbing chromophore, a vinyl ether terminated crosslinking agent, and optionally, a photoacid generator. Preferably the polymer is alkali-soluble and water insoluble. The invention further relates to a process for using such a composition, especially for irradiation from about 50 nm to about 450 nm.

The antireflective coating composition of the invention is coated on a substrate and below a positive photoresist, in order to prevent reflections in the photoresist from the substrate. This antireflective coating is photoimageable with the same wavelength of light as the top photoresist, and is also developable with the same aqueous alkaline developing solution as that used to typically develop the photoresist, thus forming a pattern in the antireflective coating. The antireflective coating composition comprises a polymer, a crosslinking agent and, optionally, a photoacid generator. The antireflective coating composition is coated on a reflective substrate. The edge bead which may form during the spinning process can then be removed using an edgebead removing solvent, since the polymer is still soluble in solvents used as edgebead removers. The coating is then baked to remove the solvent of the coating solution and also to crosslink the coating, in order to prevent, or minimize, the extent of intermixing between the layers and make the coating insoluble in the aqueous alkaline developer. Although not being bound by theory, it is believed that during the baking step a reaction takes place between the crosslinking agent, especially compounds containing vinyl ether terminal groups, and the polymer with the hydroxyl and/or a carboxyl group in the antireflective coating, to form acid labile groups within the coating. After baking and curing the antireflective coating is essentially insoluble in both an alkaline developing solution and the solvent of the photoresist.

A positive photoresist is then coated on top of the cured antireflective coating and baked to remove the photoresist solvent. The coating thickness of the photoresist is generally greater than the underlying antireflective coating. Prior to exposure to actinic radiation both the photoresist and the antireflective coating are insoluble in the aqueous alkaline developing solution of the photoresist. The bilevel system is then imagewise exposed to radiation in one single step, where an acid is then generated in both the top photoresist and the bottom antireflective coating. If a photoacid generator is present in the antireflective coating it is photolysed. When a photoacid generator is not present in the antireflective coating, the acid may diffuse from the photoresist into the antireflective coating. In a subsequent baking step, in the exposed regions the polymer of the antireflective coating with the crosslinked sites (acid labile groups), are decrosslinked in the presence of the photogenerated acid, thus making the polymer and hence the antireflective coating soluble in the aqueous alkaline developer. A subsequent developing step then dissolves the exposed regions of both the positive photoresist and the antireflective coating, thus producing a positive image, and leaving the substrate clear for further processing.

The novel antireflective coating that is useful for the novel process of this invention comprises a crosslinking agent, a polymer, and optionally, a photoacid generator. The polymer comprises at least one unit with a hydroxyl and/or a carboxyl group and at least one unit with an absorbing chromophore. The absorbing chromophore is bound within the polymer chain, as opposed to being a free dye in the composition, in order to avoid decomposition or sublimation of the free dye during the process of baking the coating.

The polymer of the antireflective coating of the invention contains at least one unit with hydroxyl and/or carboxyl group and at least one unit with an absorbing chromophore. Examples of an absorbing chromophore are hydrocarbon aromatic moieties and heterocyclic aromatic moieties with from one to four separate or fused rings, where there are 3 to 10 atoms in each ring. Examples of monomers with absorbing chromophores that can be polymerized with the monomers containing hydroxyl or carboxyl groups are vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. The substituents may be any hydrocarbyl group and may further contain heteroatoms, such as, oxygen, nitrogen, sulfur or combinations thereof. Examples of such groups are ($C_1$-$C_{12}$) alkylene, esters, ethers, etc. Other chromophores are described in U.S. Pat. No. 6,114,085, and in U.S. Pat. No. 5,652,297, U.S. Pat. No. 5,981,145, U.S. Pat. No. 6,187,506, U.S. Pat. No. 5,939,236, and U.S. Pat. No. 5,935,760, which may also be used, and are incorporated herein by reference. The preferred chromophoric monomers are vinyl compounds of substituted and unsubstituted phenyl, substituted and unsubstituted anthracyl, and substituted and unsubstituted naphthyl; and more preferred monomers are styrene, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy)ethyl acrylate, 2-hydroxy-3-phenoxypropyl acrylate, phenyl methacrylate, benzyl methacrylate, 9-anthracenylmethyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo)phenyl methacrylamide, N-(2,4-dinitrophenylaminophenyl) maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate and equivalent structures. It is within the scope of this invention that any chromophore that absorbs at the appropriate exposure wavelength may be used alone or in combination with other chromophores.

The polymer of the novel invention comprises at least one unit with a hydroxyl and/or a carboxyl group to provide alkaline solubility, and a crosslinking site. One function of the polymer is to provide a good coating quality and another is to enable the antireflective coating to change solubility during the imaging process. The hydroxyl or carboxyl groups in the polymer provide one of the components necessary for the solubility change. Examples of monomers which provide such a unit upon polymerization are without limitations, substituted or unsubstituted vinyl monomers containing a hydroxyl and or carboxyl group, such as acrylic acid, methacrylic acid, vinyl alcohol, hydroxystyrenes, vinyl monomers containing 1,1',2,2',3,3'-hexafluoro-2-propanol, although any monomer that makes the polymer alkali soluble and preferably water insoluble, may be used. The polymer may contain a mixture of monomer units containing hydroxyl and/or carboxyl groups. Vinyl monomers containing the 1,1,1,3,3,3-hexafluoro-2-propanol group are exemplified with the compounds represented by structures (1) to (6) and their substituted equivalents.

(1)

(2)

Thus a polymer may be synthesized by polymerizing monomers that contain a hydroxyl or carboxyl group with monomers that contain an absorbing chromophore. Alternatively, the alkali soluble polymer may be reacted with compounds that provide the hydroxyl or carboxyl group and compounds that provide the absorbing chromophore. In the final polymer the mole % of the unit or units containing the hydroxyl or carboxyl group can range from 5 to 95, preferably 10 to 90, and more preferably 20 to 80 and the mole % of the absorbing chromophore unit in the final polymer can range from 5 to 95, preferably 10 to 90 more preferably 20 to 80. It is also within the scope of this invention that the hydroxyl or carboxyl group is attached to the absorbing chromophore or that the chromophore is attached to the hydroxyl or carboxyl group, that is, both groups are present in the same unit. As an example the chromophoric groups described previously may have pendant hydroxyl and/or carboxyl groups or that the chromophoric groups and the hydroxyl group and/or carbonyl group are attached to the same group.

Other than the unit containing the hydroxyl and/or carboxyl group and the unit containing the absorbing chromophore, the polymer may contain other monomeric units, such units may provide other desirable properties. Examples of the third monomer are —$CR_1R_2$—$CR_3R_4$—, where $R_1$ to $R_4$ are independently H, ($C_1$-$C_{10}$) alkyl, ($C_1$-$C_{10}$) alkoxy, nitro, halide, cyano, alkylaryl, alkenyl, dicyanovinyl, $SO_2CF_3$, COOZ, $SO_3Z$, COZ, OZ, $NZ_2$, SZ, $SO_2Z$, NHCOZ, $SO_2NZ_2$, where Z is H, or ($C_1$-$C_{10}$) alkyl, hydroxy ($C_1$-$C_{10}$) alkyl, ($C_1$-$C_{10}$) alkylOCOCH$_2$COCH$_3$, or $R_2$ and $R_4$ combine to form a cyclic group such as anhydride, pyridine, or pyrolidone, or $R_1$ to $R_3$ are independently H, ($C_1$-$C_{10}$) alkyl, ($C_1$-$C_{10}$) alkoxy and $R_4$ is a hydrophilic group. Examples of the hydrophilic group, are given here but are not limited to these: O(CH$_2$)$_2$OH, O(CH$_2$)$_2$O(CH$_2$)OH, (CH$_2$)$_n$OH (where n=0-4), COO(C$_1$-C$_4$) alkyl, COOX and SO$_3$X (where X is H, ammonium, alkyl ammonium. Other monomers may be methyl methacrylate, butyl methacrylate, hydroxyethyl methacrylate and hydroxypropyl methacrylate. Monomeric units containing acid labile groups may also be used, such as hydroxystyrene, vinyl alcohol, (meth)acrylic acid capped with acid labile groups. Examples of acid labile groups, without limitation, are secondary and tertiary alkyls (up to 20 carbon atoms) with at least one β hydrogen, acetals and ketals, trimethylsilyl, and β-trimethylsilyl substituted alkyls. Representative examples of acid labile groups are tert-butyl, tert-pentyl, isobornyl, 1-alkylcyclohexyl, 1-alkylcyclopentyl, cyclohexyl, 2-alkyl-2-adamantyl, 2-alkyl-2-norbornyl. Other examples of acid labile groups are tetrahydrofuranyl, tetrahydropyranyl, substituted or unsubstituted methoxycarbonyl, β-trialkylsilylalkyl groups (e.g. CH$_2$—CH$_2$Si(CH$_3$)$_3$, CH(—CH$_2$Si(CH$_3$)$_3$)$_2$, CH$_2$—CH(Si(CH$_3$)$_3$)$_2$ and the like.

Novolak resins can also be used as suitable polymers for antireflective coatings. These resins are typically produced by conducting a condensation reaction between formaldehyde and one or more multi-substituted phenols, in the presence of an acid catalyst, such as oxalic acid, maleic acid, or maleic anhydride. Typical monomers may be formaldehyde, cresols, resorcinols, xylenols, etc.

Examples of polymers are novolaks, polyhydroxystyrenes, and copolymers of hydroxystyrene, where the other comonomers are at least one of styrene, vinyl alcohol, acrylic acid, methacrylic acid, acrylic esters, methacrylic esters, etc.

The polymers of this invention may be synthesized using any known method of polymerization, such as ring-opening metathesis, free-radical polymerization, condensation polymerization, using metal organic catalysts, or anionic or cationic copolymerization techniques. The polymer may be synthesized using solution, emulsion, bulk, suspension polymerization, or the like. The polymers of this invention are polymerized to give a polymer with a weight average molecular weight from about 1,000 to about 1,000,000, preferably from about 2,000 to about 80,000, more preferably from about 6,000 to about 50,000. When the weight average molecular weight is below 1,000, then good film forming properties are not obtained for the antireflective coating and when the weight average molecular weight is too high, then properties such as solubility, storage stability and the like may be compromised. The polydispersity (Mw/Mn) of the free-radical polymers, where Mw is the weight average molecular weight and Mn is the number average molecular weight, can range from 1.0 to 10.0, where the molecular weights of the polymer may be determined by gel permeation chromatography.

The novel antireflective coating composition is coated and then cured on the substrate by the application of heat. Heating induces a crosslinking reaction between the carboxyl group or hydroxyl group on the polymer and the crosslinking agent, and the acid labile crosslinkages are formed. A particular acid labile acetal crosslinkage can easily be facilitated when the crosslinking agent is a vinyl ether terminated compound and the polymer contains a carboxyl group or hydroxyl group. The resulting structure is highly solvent-resistant and impervious to the interdiffusion of photoresist components. Such curing processes are the same as those of the normal thermosetting antireflective coatings.

The vinyl ether terminated crosslinking agents that are useful in the instant invention can be represented by the general structure (7):

$$R\text{—(OCH=CH}_2)_n \qquad (7)$$

wherein R is selected from ($C_1$-$C_{30}$) linear, branched or cyclic alkyl, substituted or unsubstituted ($C_6$-$C_{40}$) aryl, or substituted or unsubstituted ($C_7$-$C_{40}$) alicyclic hydrocarbon; and $n \geq 2$. It is believed that the terminal vinyl ether group reacts with the hydroxyl or carboxyl group of the polymer to give an acid labile acetal linkage. Examples of such vinyl ether terminated crosslinking agents include bis(4-vinyloxy butyl) adipate; bis(4-vinyloxy butyl) succinate; bis(4-vinyloxy butyl) isophathalate; bis(4-vinyloxymethyl cyclohexylmethyl) glutarate; tris(4-vinyloxy butyl) trimellitate; bis(4-vinyloxy methyl cyclohexyl methyl) terephthalate; bis(4-vinyloxy methyl cyclohexyl methyl) isophthalate; bis(4-vinyloxy butyl) (4-methyl-1,3-phenylene) biscarbamate; bis(4-vinyloxy butyl) (methylene di-4,1-phenylene) biscarbamate; and triethyleneglycol divinylether, 1,4-cyclohexanedimentanol divinyl ether, various Vectomer® vinyl ether monomers supplied by Aldrich Company, and polymers bearing pendant vinyloxy groups. Other vinyl ether terminated crosslinking agents are described in T. Yamaoka, et al., Trends in Photochem. Photobio., 7:45 (2001); S. Moon, et al., Chem. Mater., 6:1854 (1994); or H. Schacht, et al., ACS Symp. Ser. 706:78 (1998) which may also be used, and are incorporated herein by reference.

The vinyl ether terminated crosslinking agent is preferably added to the antireflective coating in a proportion which provides 0.20-2.00 mol equivalents of vinyl ether crosslinking function per reactive group on the polymer, especially preferred is 0.50-1.50 reactive equivalents per reactive group.

In one embodiment where the antireflective coating composition comprises a photoacid generator, the photoacid generator in the antireflective coating and the photoacid generator in the photoresist, are sensitive to the same wavelength of light, and thus the same radiant wavelength of light can cause an acid to be formed in both layers. The acid in the exposed areas of the antireflective coating, present either through diffusion from the photoresist or through photogeneration from the photoacid generator in the antireflective film, reacts with the acid labile crosslinkages to decrosslink the polymer, thus making the exposed areas of the antireflective coating soluble in the aqueous alkaline developer. The photoacid generator of the antireflective coating chosen depends on the photoresist to be used. The photoacid generator (PAG) of the novel composition is selected from those which absorb at the desired exposure wavelength, preferably 248 nm, 193 nm and 157 nm for deep ultraviolet photoresists, and naphthoquinone diazides or sulfonium salts for 365 nm, 436 nm and broadband photoresists. Suitable examples of the acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, and nitrobenzyl sulfonate esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluoromethane sulfonate, triphenylsulfonium nonafluorobutane sulfonate and the like. Other compounds that form an acid upon irradiation that may be used, are triazines, oxazoles, oxadiazoles, thiazoles, substituted 2-pyrones. Phenolic sulfonic esters, bis-sulfonylmethanes, bis-sulfonylmethanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl)imide and their homologues are also possible candidates. Mixtures of photoactive compounds may also be used.

Figure 1:
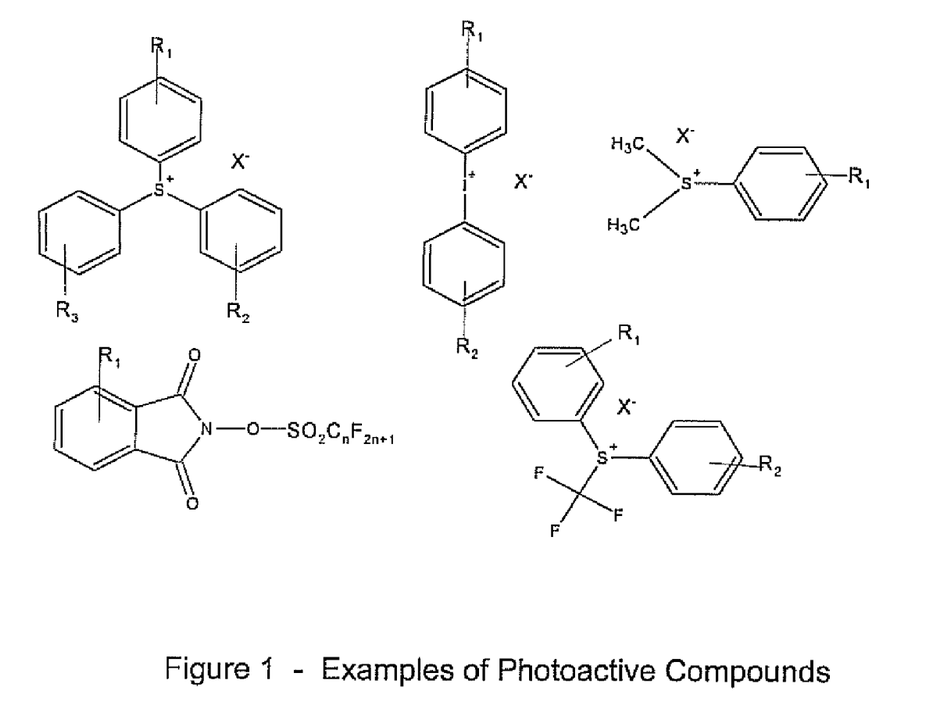
FIG. 1 shows examples of the structures of photoacid generators.

FIG. 1 shows examples of PAG structures, such as onium salts and hydroxyamic derivatives which are useful, where $R_1$, $R_2$ and $R_3$ are independently alkyl, fluoroalkyl, F. $OC_nH_{2n+1}$, $OC_nF_{2n+1}$, $CO_2$-tert-Bu, $OCH_2$—$CO_2$-tert-Bu, $OCH_2OCH_3$ (n=1-4); $X^-$ is anion of non-nucleophilic strong acid e.g. $^-O(SO_2C_nF_{2n=1})$, $AsF_6^-$, $SbF_6^-$, $—N(SO_2C_nF_{2n=1})_2$, $^-C(SO_2C_nF_{2n=1})_3$.

For exposure at 365 nm the photoacid generator can be sulfonium salts or diazonaphthoquinones, especially 2,1,4-diazonaphthoquinones that are capable of producing acids that can react with the acid labile groups of the polymer. Oxime sulfonates, substituted or unsubstituted naphthalimidyl triflates or sulfonates are also known as photoacid generators. Any photoacid generator that absorbs light at the same wavelength as the top photoresist may be used. Photoacid generators known in the art may be used, such as those disclosed in the U.S. Pat. No. 5,731,386, U.S. Pat. No. 5,880,169, U.S. Pat. No. 5,939,236, U.S. Pat. No. 5,354,643, U.S. Pat. No. 5,716,756, U.S. Pat. No. DE 3,930,086, U.S. Pat. No. DE 3,930,087, German Patent Application P 4,112,967.9, F. M. Houlihan et al., J. Photopolym. Sci. Techn., 3:259 (1990); T. Yamaoka et al., J. Photopolym. Sci. Techn., 3:275 (1990)), L. Schlegel et al., J. Photopolym. Sci. Techn., 3:281 (1990) or M. Shirai et al., J. Photopolym. Sci. Techn., 3:301 (1990), and incorporated herein by reference.

The solvent for the antireflective coating is chosen such that it can dissolve all the solid components of the antireflective coating. Examples of suitable solvents for the antireflective coating composition are cyclohexanone, cyclopentanone, anisole, 2-heptanone, ethyl lactate, propylene glycol monomethyl ether acetate, propylene glycol monomethyl ether, butyl acetate, gamma butyroacetate, ethyl cellosolve acetate, methyl cellosolve acetate, methyl 3-methoxypropionate, ethyl pyruvate, 2-methoxybutyl acetate, diacetone alcohol, diethyl carbonate, 2-methoxyethyl ether, but ethyl lactate, propylene glycol monomethyl ether acetate, propylene glycol monomethyl ether or mixtures thereof are preferred. Solvents with a lower degree of toxicity and good coating and solubility properties are generally preferred.

The composition of the present invention may further comprise an acid or a thermal acid generator. Crosslinking can take place between a polymer containing a hydroxyl and/or carboxyl group and a crosslinking agent in the presence of heat, however, typically reaction times may be long. Thermal acid generators or acids are used to accelerate the crosslinking reaction and are desirable for instances where short curing times are preferred. Thermal acid generators liberate the acid upon heating. Any known acids or thermal acid generators may be used, exemplified without limitations, by 2,4,4,6-tetrabromocyclohexadienone, benzoin tosylate, squaric acid, 2-nitrobenzyl tosylate, chloroacetic acid, toluenesulfonic acid, methanesulfonic acid, nonaflate acid, triflic acid, other alkyl esters of organic sulfonic acids, salts of these mentioned acids. However, it has been found that for certain components some acids and acids produced by thermal acid generators, which have high acidity, can lead to undercutting and can prevent the desired photoimaging process from taking place. Thus, it has been unexpectedly found that acids with moderate acidity, i.e. with a pKa ($-\log_{10}$ of the acid dissociation constant) greater than 1.0 are preferred, especially in combination with a vinyl terminated crosslinking agent. Acids with a pKa of less than 5.0 and greater than 1.0 are also preferred. The resulting acetal linkages are easily cleavable in the presence of photogenerated acids. Examples, without limitations, of acids or acids derived from thermal acid generators with moderate acidity are maleic acid (pKa of 1.83), chloroacetic acid (pKa of 1.4), dichloroacetic acid (pKa of 1.48), oxalic acid (pKa of 1.3), cinnamic acid (pKa of 4.45), tartaric acid (pKa of 4.3), gylcolic acid (pKa of 3.8), fumaric acid (pKa of 4.45), malonic acid (pKa of 2.8), cyanoacetic acid (pKa of 2.7), etc. Acids which are blocked by bases to form a thermal acid generator are preferred. Acids, such as those described above, may be blocked with bases such as amines. Typical bases are triethyl amine, tripropyl amine, trimethyl amine, tributyl amine, tripentyl amine, tridodecyl amine etc. Additionally, diaryl or trialkyl sulfonium salts with anions of weak acids, such as carboxylic acid or aryl carboxylic acid may be used. Acids which are blocked by bases may be formed by combining the acid with a base, where the acid:base ratio ranges from about 1:1 to about 1:3. Further examples of acids with the desired pKa and their salts can be found by one of ordinary skill in the art by reviewing the available literature, such as in CRC Handbook of Chemistry and Physics, published by CRC Press Inc. and incorporated herein by reference. In some embodiments it may also be desirable that the thermal acid be such that once the acid is generated it does not remain permanently in the coating and therefore does not facilitate the reverse reaction, but is removed from the film. It is believed that, once crosslinking takes place the acid is decomposed or volatilized by heat and the decomposition products are baked out of the film, or the acid may sublime from the coating. Thus none or very little of the free acid remains in the film after curing, and the reverse reaction causing the decomposition of the acetal linkage does not take place. Thermal acid generators which can generate an acid and then be removed prior to coating of the photoresist are preferred in some cases. Weak acids that remain in the film may also be functional, as they may not greatly hinder the decomposition of the acetal linkage. The acid or acid derived from the thermal acid generator is preferably removed from the antireflective coating at temperatures ranging from about 130° C. to about 220° C., more preferably 150° C. to about 200° C. The acids or thermal acid generators may be present in the antireflective composition at levels ranging from 0.1 to 25 weight % of solids, especially 0.1 to about 5 weight %.

Typical antireflective coating compositions of the present invention may comprise up to about 15 percent by weight of the solids, preferably less than 8 percent, based on the total weight of the coating composition. The solids may comprise from 0 to 25 weight percent of the photoacid generator, 50 to 99 weight percent of polymer, 1 to 50 weight percent of the crosslinking agent and optionally 0 to 25 weight percent of the acid or thermal acid generator, based on the total solids content of the antireflective coating composition. Preferably the photoacid generator level ranges from about 0.01 to about 20 weight %. Preferably the crosslinking agent ranges from about 5 to about 40 weight percent, more preferably 10 to 35 weight percent. The solid components are dissolved in the solvent, or mixtures of solvents, and filtered to remove impurities. The components of the antireflective coating may also be treated by techniques such as passing through an ion exchange column, filtration, and extraction process, to improve the quality of the product.

Other components may be added to the antireflective composition of the present application in order to enhance the performance of the coating, e.g. lower alcohols, dyes, surface leveling agents, adhesion promoters, antifoaming agents, etc. These additives may be present at up to 30 weight percent level. Other polymers, such as, novolaks, polyhydroxystyrene, polymethylmethacrylate and polyarylates, may be added to the composition, providing the performance is not negatively impacted. Preferably the amount of this polymer is kept below 50 weight % of the total solids of the composition, more preferably 35 weight %, and even more preferably below 20 weight %. Bases may also be added to the composition to enhance stability. Both photobases and nonphotobases are known additives. Examples of bases are amines, ammonium hydroxide, and photosensitive bases. Particularly preferred bases are tetrabutylammonium hydroxide, triethanolamine, diethanol amine, trioctylamine, n-octylamine, trimethylsulfonium hydroxide, triphenylsulfonium hydroxide, bis(t-butylphenyl)iodonium cyclamate and tris(tert-butylphenyl)sulfonium cyclamate.

The absorption parameter (k) of the novel composition ranges from about 0.1 to about 1.0, preferably from about 0.15 to about 0.7 as measured using ellipsometry. The refractive index (n) of the antireflective coating is also optimized. The n and k values can be calculated using an ellipsometer, such as the J. A. Woollam WVASE VU-302™ Ellipsometer. The exact values of the optimum ranges for k and n are dependent on the exposure wavelength used and the type of application. Typically for 193 nm the preferred range for k is 0.1 to 0.75, for 248 nm the preferred range for k is 0.15 to 0.8, and for 365 nm the preferred range is from 0.1 to 0.8. The thickness of the antireflective coating is less than the thickness of the top photoresist. Preferably the film thickness of the antireflective coating is less than the value of (wavelength of exposure/refractive index), and more preferably it is less than the value of (wavelength of exposure/2 times refractive index), where the refractive index is that of the antireflective coating and can be measured with an ellipsometer. The optimum film thickness of the antireflective coating is determined by the exposure wavelength, refractive indices of the antireflective coating and of the photoresist, absorption characteristics of the top and bottom coatings, and optical characteristics of the substrate. Since the bottom antireflective coating must be removed by exposure and development steps, the optimum film thickness is determined by avoiding the optical nodes where no light absorption is present in the antireflective coating.

The antireflective coating composition is coated on the substrate using techniques well known to those skilled in the art, such as dipping, spin coating or spraying. Various substrates known in the art may be used, such as those that are planar, have topography or have holes. Examples of semiconductor substrates are crystalline and polycrystalline silicon, silicon dioxide, silicon (oxy)nitride, aluminum, aluminum/silicon alloys, and tungsten. In certain cases there can be a buildup of photoresist film at the edges of the substrate, referred to as edge bead. This edge bead can be removed using a solvent or mixture of solvents using techniques well known to those of ordinary skill in the art. The composition of the present invention is particularly compatible with edge bead removers. Typical solvents used for edge bead removers are ethyl lactate, butyl acetate, propyleneglycol monomethyletheracetate, propyleneglycol monomethylether, or mixtures thereof. The coating is then cured. The preferred range of temperature is from about 120° C. to about 240° C. for about 30-120 seconds on a hot plate or equivalent heating unit, more preferably from about 150° C. to about 200° C. for 45-90 seconds. The film thickness of the antireflective coating ranges from about 20 nm to about 300 nm. The optimum film thickness is determined, as is well known in the art, to be where good lithographic properties are obtained, especially where no standing waves are observed in the photoresist. It has been unexpectedly found that for this novel composition very thin coatings can be used due to the excellent absorption and refractive index properties of the film. The cured antireflective coating is also insoluble at this stage in the alkaline developing solution. The photoresist can then be coated on top of the antireflective coating.

Positive photoresists, which are developed with aqueous alkaline solutions, are useful for the present invention, provided the photoactive compounds in the photoresist and the antireflective coating absorb at the same exposure wavelength used for the imaging process for the photoresist. Positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the formation of a positive image in the photoresist coating. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the drive toward miniaturization reduces the critical dimensions on the devices.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. The sensitivity of these types of resists typically ranges from about 300 nm to 440 nm.

Photoresists sensitive to short wavelengths, between about 180 nm and about 300 nm can also be used. These photoresists normally comprise polyhydroxystyrene or substituted polyhydroxystyrene derivatives, a photoactive compound, and optionally a solubility inhibitor. The following references exemplify the types of photoresists used and are incorporated herein by reference, U.S. Pat. No. 4,491,628, U.S. Pat. No. 5,069,997 and U.S. Pat. No. 5,350,660. Particularly preferred for 193 nm and 157 nm exposure are photoresists comprising non-aromatic polymers, a photoacid generator, optionally a solubility inhibitor, and solvent. Photoresists sensitive at 193 nm that are known in the prior art are described in the following references and incorporated herein, EP 794458, WO 97/33198 and U.S. Pat. No. 5,585,219, although any photoresist sensitive at 193 nm may be used on top of the antireflective composition of this invention.

A film of photoresist is then coated on top of the cured antireflective coating and baked to substantially remove the photoresist solvent. The photoresist and the antireflective coating bilevel layers are then imagewise exposed to actinic radiation. In a subsequent heating step the acid generated during exposure step reacts to de-crosslink the polymer of the antireflective coating composition and thus rendering the exposed region of the antireflective coating alkali soluble in the developing solution. The temperature for the postexposure bake step can range from 40° C. to 200° C. for 30-200 seconds on a hot plate or equivalent heating system, preferably from 80° C. to 160° C. for 40-90 seconds. In some instances, it is possible to avoid the postexposure bake, since for certain chemistries, such as some acetal acid labile linkages, deprotection proceeds at room temperature. The polymer in the exposed regions of the antireflective coating is now soluble in an aqueous alkaline solution. The bilevel system is then developed in an aqueous alkaline developer to remove the photoresist and the antireflective coating. The developer is preferably an aqueous alkaline solution comprising, for example, tetramethyl ammonium hydroxide. The developer may further comprise additives, such as surfactants, polymers, isopropanol, ethanol, etc. The process of coating and imaging photoresist coatings and antireflective coatings is well known to those skilled in the art and is optimized for the specific type of photoresist and antireflective coating combination used. The imaged bilevel system can then be processed further as required by the manufacturing process of integrated circuits, for example metal deposition and etching.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The absorption parameter (k) and the refractive index (n) were measured using variable angle spectrophotometric ellipsometry. The bottom antireflective coating (B.A.R.C.) solutions were spin coated on primed silicon wafers and baked to get a given film thickness. The coated wafers were then measured using an ellipsometer manufactured by J. A. Woollam or Sopra Corporation. The obtained data were fitted to get the k and n values of the B.A.R.C. films.

Synthesis Example 1

To a 250 ml 4 neck flask, equipped with a condenser, a thermometer, a nitrogen gas inlet and a mechanical stirrer, were added methacrylate ester of 9-anthracene methanol (AMMA) (4.2 g), 4-acetoxystyrene (13.8 g), azobisisobutylonitrile (AIBN) (0.8 g) and propyleneglycol monomethylether (PGME) (50 g). A solution was obtained and degassed for 15 minutes. Then the reaction mixture was heated to 70° C. and stirred at that temperature for 5 hours under flowing nitrogen. After the completion of the polymerization, the obtained solution was cooled down to the room temperature and tetramethylammonium hydroxide (26 wt % in water) solution (7 g) was added. The reaction temperature was raised to 40° C. and was kept for 3 hours before being raised to 60° C. After heating at 60° C. for 8 hours, the reaction mixture was cooled down to room temperature and was acidified to pH 6 using acetic acid. The resultant polymer was precipitated into 600 ml of methanol and the obtained solid was filtered, washed with methanol and deionized water, and then dried. The precipitated polymer was redissolved in 60 g of PGME and precipitated again into 600 ml of methanol. The solid was filtered, washed and dried at 40° C. under vacuum. The obtained polymer (represented by the structure (I)) had a weight average molecular weight (Mw) of 12,800 and number average molecular weight (Mn) of 5,400 as measured on a gel permeation chromatography (GPC) using polystyrene standards.

(I)

(V)

Synthesis Examples 2-5

Polymers with structures (II) to (V) were synthesized in the similar procedure as Synthesis Example 1 except using the different types and amount of monomers in accordance with the monomer ratio given in the structures.

(II)

(III)

(IV)

Example 1

A copolymer represented by structure (I) from Synthesis Example 1 (2.5 g), tris(4-vinyloxy butyl) trimellitate (0.25 g, Vectomer®5015, available from Aldrich Co.), and triphenylsulfonium nonaflate (0.05 g) were dissolved in 68 g propyleneglycol monomethylether acetate (PGMEA) and 29 g of propyleneglycol monomethylether (PGME) to form an antireflective coating composition. The solution was filtered through a 0.1 µm filter.

Example 2

A copolymer represented by structure (I) from Synthesis Example 1 (3 g), bis(4-vinyloxy butyl) adipate (0.4 g, Vectomer®4060, available from Aldrich Co.), and oxalic acid (0.01 g) were dissolved in 67.6 g PGMEA and 28.8 g PGME to form an antireflective coating composition. The solution was filtered through a 0.1 µm filter.

Example 3

A copolymer represented by structure (II) from Synthesis Example 2 (2.6 g), tris(4-vinyloxy butyl) trimellitate (0.26 g, Vectomer®5015, available from Aldrich), and a triphenylsulfonium nonaflate (0.05 g) were dissolved in 68 g PGMEA and 29 g PGME to form an antireflective coating composition. The solution was filtered through a 0.1 µm filter.

Example 4

A copolymer represented by structure (I) from Synthesis Example 1 (3 g), triethyleneglycol divinylether (0.6 g, RAPI-CURE® DVE-3, available from ISP (Japan) Ltd.), and oxalic acid (0.01 g) were dissolved in 67.6 g PGMEA and 28.8 g PGME by stirring to form an antireflective coating composition. The solution was filtered through a 0.1 µm filter.

Example 5

A copolymer represented by structure (III) from Synthesis Example 3 (4 g), tris(4-vinyloxy butyl) trimellitate (0.5 g, Vectomer®5015, available from Aldrich), and oxalic acid (0.02 g) were dissolved in 70 g PGMEA and 30 g PGME stirring to form an antireflective coating composition. The solution was filtered through a 0.1 µm filter.

Example 6

A copolymer represented by structure (IV) from Synthesis Example 4 (2 g), tris(4-vinyloxy butyl) trimellitate (0.2 g, Vectomer®5015, available from Aldrich Co.), and oxalic acid (0.01 g) were dissolved in 70 g PGMEA and 30 g PGME by stirring to form an antireflective coating composition. The solution was filtered through a 0.1 μm filter.

Example 7

A copolymer represented by structure (V) from Synthesis Example 5 (2 g), tris(4-vinyloxy butyl) trimellitate (0.2 g, Vectomer®5015, available from Aldrich Co.), and oxalic acid (0.01 g) were dissolved in 70 g PGMEA and 30 g PGME by stirring to form an antireflective coating composition. The solution was filtered through a 0.1 μm filter.

Example 8

The solution prepared in Example 1 was spin coated onto a 6 inch silicon wafer at 2500 rpm for 60 seconds and then baked on a hot plate at 170° C. for 90 seconds to form a cured antireflective coating layer. The film thickness of the coating, as determined by ellipsometry manufactured by J. A. Woollam company or by Sopra corporation, was about 700 Å. By observing the coated wafers, it was seen that the edge-bead formed during the coating process on the antireflective coating could easily be removed with a back-side rinse of a silicon wafer with a mixture of 30 wt % PGMEA and 70 wt % PGME, an edgebead removing solvent.

The solutions prepared in Examples 1-8 were spin coated on 6 inch silicon wafers and baked on a hot plate at different temperatures (each baking temperature 2 wafers for each sample). One coated wafer from each of the set of B.A.R.C coatings was puddled with PGMEA, a common photoresist solvent, and the other with developer, each for 60 seconds and then spin dried. No obvious film thickness change in the antireflective layer was observed on the wafers when baked above 150° C., indicating that the films were highly crosslinked and solvent-resistant, thus there would be no intermixing with the photoresist solvent when the photoresist was coated over the B.A.R.C. When a comparative test was performed on the formulations prepared without the vinyl ether terminated crosslinking agent, it was observed that the entire coating could be removed both in PGMEA and the developer.

Example 9

The solutions prepared in Examples 1-4 were spin coated on 6 inch silicon wafers baked at 170° C. for 90 seconds to give a thickness of 60 nanometers. Then a DUV photoresist, AZ® DX6270P (available from Clariant (Japan) K. K.) was coated thereon and softbaked at 120° C. for 90 seconds to give a thickness of 0.45 micron. The coated wafers were imagewise exposed using Cannon FPA-3000 EX5 248 nm stepper. The exposed wafers were postexposure baked for 90 seconds at 130° C., followed by a puddle development of 60 seconds with AZ® 300 MIF Developer (2.38 weight % tetramethyl ammonium hydroxide aqueous solution available from Clariant Corp.). The secondary electron microscope results showed at 22 mJ/cm$^2$, both the 0.20 μm 1:1 dense lines and 0.20 μm isolated lines was completely opened both in the photoresist layer and the antireflective coating layer. No obvious standing waves due to the reflection from the substrate were observed on the pattern profiles.

Example 10

1.5 g of poly(hydroxystyrene-methacrylate) (55/45 molar ratio), 0.075 g of oxalic acid/triethylamine (1:1), 0.06 g of triphenylsulfonium triflate, and 0.225 g of Vectomer™5015 (available from Aldrich Corp.) were dissolved in 98.5 g of ethyl lactate to give the B.A.R.C. solution. The solution was filtered through 0.2 μm microfilter. The B.A.R.C. coating gave a refractive index (n) and absorption (k) at 193 nm of 1.59 and 0.62 respectively as measured by a J. A. Woollam WVASE VU-302™ Ellipsometer.

The B.A.R.C. solution was coated on a primed silicon wafer heated on a hotplate at 200° C. for 60 seconds to give a film thickness of 35 nm. The B.A.R.C. wafer was coated with AZ®1020P photoresist (available from Clariant Corp., Somerville, N.J.) with a film thickness of 330 nm. The wafer was then baked on a hotplate for 120° C. for 60 seconds. The coated wafer was exposed using an ISI 193 nm ministepper for imagewise exposure. The exposed wafer as then post exposure baked for 90 seconds at 130° C. and followed with a 30-second puddle development at 23° C. using of AZ® 300 MIF Developer. Using a secondary electron microscope, 0.15 μm photoresist/B.A.R.C. lines (1:1) were obtained at a dose of 40 mJ/cm$^2$.

Example 11

0.075 g of poly(hydroxystyrene-methacrylate) (55/45 molar ratio), 0.015 g of cyanoacetic acid, and 0.022 g of Vectomer™5015 were dissolved in 8.0 g of propylene glycol monomethyl ether. The solution was filtered through 0.2 μm microfilter.

The B.A.R.C. solution was coated on a primed silicon wafer and heated on a hotplate at 175° C. for 60 seconds to give a film thickness of 293 Å. The B.A.R.C. wafer was coated with AZ® T430 photoresist (available from Clariant Corp., Somerville, N.J.), heated on a hotplate for 120° C. for 60 seconds to give a film thickness of 116 nm. The coated wafer was exposed using an ISI 193 nm ministepper for imagewise exposure. The exposed wafer was then post exposure baked for 20 seconds at 120° C. and followed with a 30-second puddle development at 23° C. using of AZ® 300 MIF Developer. Using a secondary electron microscope, 0.20 μm photoresist/B.A.R.C. lines (1:1) were obtained at a dose of 20 mJ/cm2.

Example 12

The B.A.R.C. solution from Example 10 was coated on a primed silicon wafer and baked at 175° C. for 90 seconds to give a film thickness of 499 Å. The B.A.R.C. wafer was coated with AZ® T430 photoresist (available from Clariant Corp., Somerville, N.J.), heated on a hotplate for 120° C. for 60 seconds to give a film thickness of 116 nm. The coated wafer was exposed using an ISI 193 nm ministepper for imagewise exposure. The exposed wafer was then post exposure baked for 20 seconds at 120° C. and followed with a 30-second puddle development at 23° C. using of AZ® 300 MIF Developer. Using a secondary electron microscope, 0.35 μm photoresist/B.A.R.C. lines (1:1) were obtained at a dose of 21 mJ/cm2.

The invention claimed is:
1. A process for forming a positive image comprising:
   a) forming a coating of the bottom photoimageable antireflective coating composition which is capable of being developed in an aqueous alkaline developer, wherein the antireflective coating composition comprises a polymer comprising at least a chromophore group and at least hydroxyl and/or a carboxyl group, a vinyl ether terminated crosslinking agent, and optionally, a photoacid generator on a substrate, further where the chromophore comprises a substituted or unsubstituted anthracyl group;

b) baking the antireflective coating, c) providing a coating of a top photoresist layer over the bottom coating;

d) imagewise exposing the photoresist and bottom coating layers to actinic radiation of same wavelength;

e) post-exposure baking the photoresist and bottom coating layers on the substrate; and, f) developing the photoresist and bottom coating layers with an aqueous alkaline solution, thereby forming a pattern in the photoresist layer and the antireflective coating layer.

2. The process according to claim 1, further comprising the step of removal of an edgebead after the coating and prior to the baking of the antireflective coating composition.

3. The process according to claim 1, wherein the antireflective coating becomes insoluble in organic solvents and aqueous alkaline solution after the baking step prior to coating the photoresist layer and becomes soluble in aqueous alkaline solution after exposure to actinic radiation prior to developing the photoresist and bottom antireflective coating layer.

4. The process according to claim 1, where the imagewise exposure is in the range of 50 nm to 450 nm.

5. The process according to claim 1, where the developer comprises tetramethylammonium hydroxide.

6. The process according to claim 1, wherein the recurring unit of the antireflective coating containing a hydroxyl and/or a carboxyl group is derived from a monomer selected from acrylic acid, methacrylic acid, vinyl alcohol, hydroxystyrenes, copolymers of hydroxystyrene and vinyl monomers containing 1,1,1,3,3,3-hexafluoro-2-propanol.

7. The process according to claim 1, wherein the chromophore group and the hydroxyl and/or a carboxyl group of the antireflective coating composition are present in the same recurring unit.

8. The process according to claim 1, wherein the vinyl ether terminated crosslinking agent of the antireflective coating is represented by the general structure below;

wherein, R is selected from a $(C_1-C_{30})$ linear, branched or cyclic alkyl, substituted or unsubstituted $(C_6-C_{40})$ aryl, and substituted or unsubstituted $(C_7-C_{40})$ alicyclic hydrocarbon; and $n \geq 2$.

9. The process of claim 1, wherein the antireflective coating composition further comprises an acid or a thermal acid generator.

10. The process of claim 9, wherein the acid or the acid derived from the thermal acid generator has a pKa greater than 1.0.

11. The process of claim 9, wherein the acid derived from the thermal acid generator is removed from the antireflective coating at temperatures below 220° C.

12. The process according to claim 1, wherein the antireflective coating composition further comprises a dye.

13. The process according to claim 12, wherein the dye is selected from the group consisting of a monomeric dye, a polymeric dye and a mixture of a monomeric and a polymeric dye.

14. The process according to claim 1, wherein the antireflective coating composition has a k value in the range of 0.1 to 1.0.

15. The process according to claim 1, wherein the antireflective layer has a thickness less than the thickness of the photoresist.

16. A process for forming a positive image comprising:

a) forming a coating of the bottom photoimageable antireflective coating composition which is capable of being developed in an aqueous alkaline developer, wherein the antireflective coating composition comprises a polymer comprising at least a chromophore group and at least a hydroxyl and/or a carboxyl group, a vinyl ether terminated crosslinking agent, a thermal acid generator, and optionally, a photoacid generator on a substrate;

c) baking the antireflective coating, c) providing a coating of a top photoresist layer over the bottom coating;

d) imagewise exposing the photoresist and bottom coating layers to actinic radiation of same wavelength;

e) post-exposure baking the photoresist and bottom coating layers on the substrate; and, f) developing the photoresist and bottom coating layers with an aqueous alkaline solution, thereby forming a pattern in the photoresist layer and the antireflective coating layer.

17. The process according to claim 16, further comprising the step of removal of an edgebead after the coating and prior to the baking of the antireflective coating composition.

18. The process according to claim 16, wherein the antireflective coating becomes insoluble in organic solvents and aqueous alkaline solution after the baking step prior to coating the photoresist layer and becomes soluble in aqueous alkaline solution after exposure to actinic radiation prior to developing the photoresist and bottom antireflective coating layer.

19. The process according to claim 16, where the imagewise exposure is in the range of 50 nm to 450 nm.

* * * * *